US006852652B1

(12) United States Patent
Maa et al.

(10) Patent No.: US 6,852,652 B1
(45) Date of Patent: Feb. 8, 2005

(54) METHOD OF MAKING RELAXED SILICON-GERMANIUM ON GLASS VIA LAYER TRANSFER

(75) Inventors: Jer-Shen Maa, Vancouver, WA (US); Jong-Jan Lee, Camas, WA (US); Douglas J. Tweet, Camas, WA (US); Steve Roy Droes, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 10/674,369

(22) Filed: Sep. 29, 2003

(51) Int. Cl.[7] .............................................. H01L 21/00
(52) U.S. Cl. ........................................................ 438/933
(58) Field of Search ................................ 438/933, 938, 438/197, 473, 311, 607, 663, 167

(56) References Cited

U.S. PATENT DOCUMENTS

| | | | | |
|---|---|---|---|---|
| 5,891,769 A | * | 4/1999 | Liaw et al. ................. | 438/167 |
| 6,602,613 B1 | * | 8/2003 | Fitzgerald ................... | 428/641 |
| 6,689,211 B1 | * | 2/2004 | Wu et al. ..................... | 117/94 |
| 6,703,144 B2 | * | 3/2004 | Fitzgerald ................... | 428/641 |
| 6,750,130 B1 | * | 6/2004 | Fitzgerald ................... | 438/607 |

OTHER PUBLICATIONS

K. Rim et al., *Strained Si for sub–100 nm MOSFETs*, Proceedings of the 3rd International Conference on SiGe Epitaxy and Heterostructures, Sante Fe, New Mexico, Mar. 9–12, 2002, p125.

M. Bruel et al., *Smart–Cut: A New Silicon On Insulator Material Technology Based on Hydrogen Implantation and Wafer Bonding*, Jpn. J. Appl. Phys., vol. 36, 1636 (1997).

Z.–Y. Cheng et al., *SiGe–on insulator (SG01): Substrate Preparation and MOSFET Fabrication for Electron Mobility Evaluation*, 2001 IEEE International SOI Conference Proceedings p 13.

Z. Cheng et al., *Relaxed Ssilicon–Germanium on Insulator Substrate by Layer Transfer*, Journal of Electronics Materials, vol. 30, No. 12, 2001, L37.

G. Taraschi et al., *Relaxed SiGe on Insulator Fabricated via Wafer Bonding and Layer Transfer: Etch–back and Smart–Cut Alternatives*, Electrochemical Society Proceedings vol. 2001–3, p27.

L.–J. Huang et al., *Carrier Mobility Enhancement in Strained Si–on–Insulator Fabricated by Wafer Bonding*, 2001 Symposium on VLSI Technology Digest of Technical Papers, p 57.

7. T.A. Langdo et al., *Preparation of Novel SiGe–Free Strained Si on Insulator Substrates*, 2002 IEEE International SOI Conference Proceedings, Oct. 2001, p211.

P.D. Moran, et al., *Kinetics of Strain Relaxation in Semiconductor Films Grown on Borosilicate Glass–Bonded Substrates*, Journal of Electronics Materials, vol. 30, No. 7, 2001, 802.

R. Huang et al., *Relaxation of a Strained Elastic Film on a Viscous Layer*, Mat. Res. Soc. Symp. Proc. vol 695, 2002.

* cited by examiner

*Primary Examiner*—David Nhu
(74) *Attorney, Agent, or Firm*—David C. Ripma; Matthew D. Rabdau; Joseph P. Curtin

(57) ABSTRACT

A method of forming a silicon-germanium layer on an insulator includes preparing a silicon substrate; depositing a layer of silicon-germanium on the silicon substrate to form a silicon/silicon-germanium portion; implanting hydrogen ions in the silicon-germanium layer; preparing an insulator substrate; bonding the silicon/silicon-germanium portion to the insulator substrate with the silicon-germanium layer in contact with the insulator substrate to form a bonded entity; curing the bonded entity; and thermally annealing the bonded entity to split the bonded entity into a silicon/silicon germanium portion and a silicon-germanium-on-insulator portion and to relax the silicon germanium layers.

13 Claims, 8 Drawing Sheets

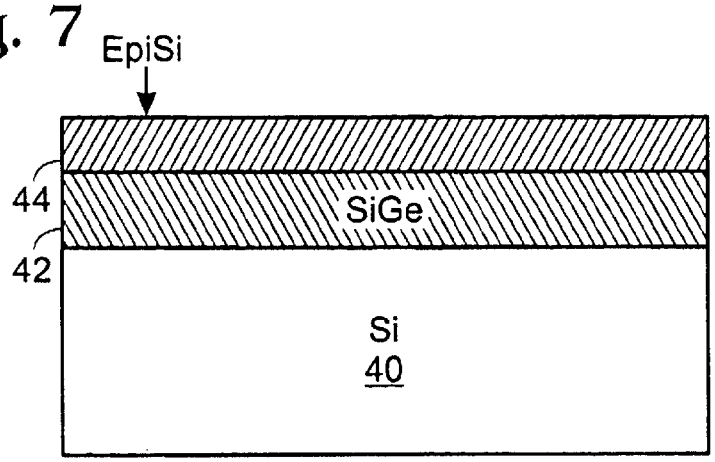
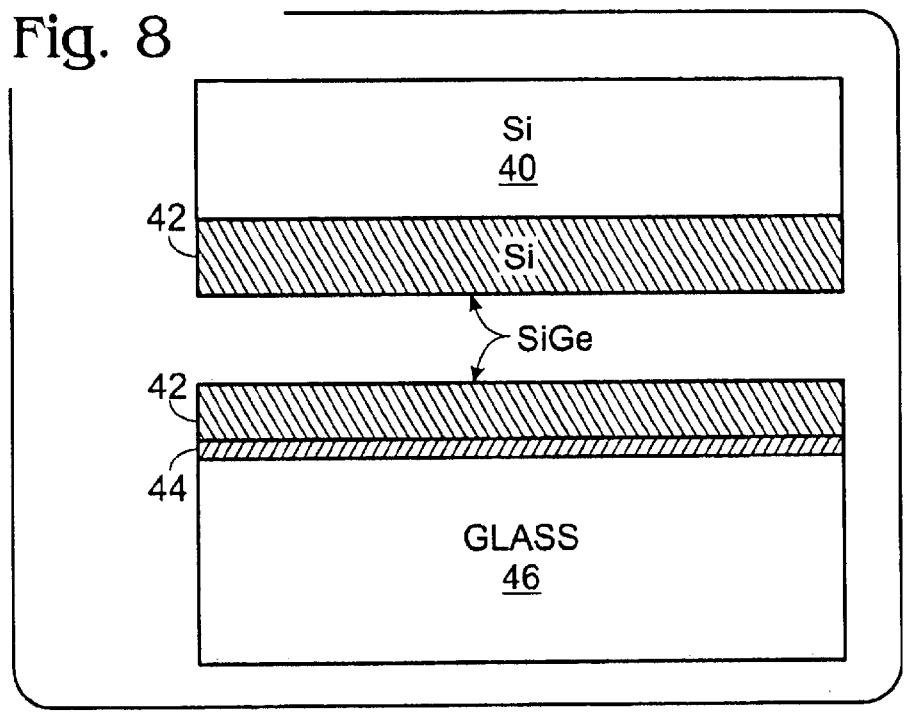
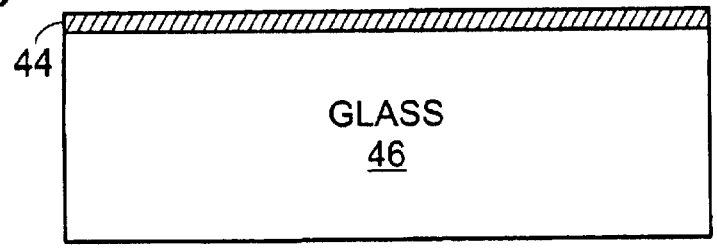

METHOD OF MAKING RELAXED SILICON-GERMANIUM ON GLASS VIA LAYER TRANSFER

FIELD OF THE INVENTION

This invention relates to high speed CMOS integrated circuits, and specifically to an efficient fabrication method for formation of a relaxed SiGe layer on a glass insulator.

BACKGROUND OF THE INVENTION

In strained silicon CMOS, the carrier transport properties are enhanced by the biaxial tensile strain in the strained silicon layer on relaxed SiGe. Strained silicon MOSFETs have been demonstrated on SiGe-on-insulator (SGOI) substrates with the combination of the high mobility in strained silicon and advantages of SOI structures in sub-100 nm devices. K. Rim et al., *Strained Si for sub-100 nm MOSFETs*, Proceedings of the 3rd International Conference on SiGe Epitaxy and Heterostructures, Sante Fe, N. Mex., Mar. 9–12, 2002, p125.

Methods to fabricate SiGe-on-insulator substrate have been reported by the MIT group and IBM. Transfer of SiGe onto insulator substrate was achieved by Smart-Cut technique through hydrogen implantation and annealing. M. Bruel et al., *Smart-Cut: A New Silicon On Insulator Material Technology Based on Hydrogen Implantation and Wafer Bonding*, Jpn. J. Appl. Phys., Vol. 36, 1636 (1997); Z.-Y. Cheng et al., *SiGe-on insulator (SGOI): Substrate Preparation and MOSFET Fabrication for Electron Mobility Evaluation*, 2001 IEEE International SOI Conference Proceedings p 13; Z. Cheng et al., *Relaxed Silicon-Germanium on Insulator Substrate by Layer Transfer*, Journal of Electronics Materials, Vol. 30, No. 12, 2001, L37, and G. Taraschi et al., *Relaxed SiGe on Insulator Fabricated via Wafer Bonding and Layer Transfer: Etch-back and Smart-Cut Alternatives*, Electrochemical Society Proceedings Vol. 2001-3, p27; and L.-J. Huang et al., *Carrier Mobility Enhancement in Strained Si-on-Insulator Fabricated by Wafer Bonding*, 2001 Symposium on VLSI Technology Digest of Technical Papers, p 57.

In the prior art, a thick layer SiGe is deposited on a silicon substrate, which includes a graded SiGe buffer layer and a relaxed SiGe layer having a constant germanium concentration. Following surface planarization, as by CMP, hydrogen is implanted into the SiGe layer to facilitate wafer splitting. The Si/SiGe wafer is then bonded to a oxidized silicon substrate. The SiGe-on-oxide is separated from the rest of the couplet by thermal annealing, wherein splitting occurs along hydrogen-implantation-induced microcracks, which parallel the bonding interface.

A technique to form a SiGe-free strained silicon on insulator substrates has been also reported by T. A. Langdo et al., *Preparation of Novel SiGe-Free Strained Si on Insulator Substrates*, 2002 IEEE International SOI Conference Proceedings, October 2001, p211. This technique is similar to previously described techniques, except that a thin layer of epitaxial silicon is deposited on the SiGe layer before wafer bonding. After bonding and wafer splitting, the SiGe layer is removed by oxidation and HF etching, enabling the formation of very thin and uniform strained silicon on oxide surface.

Relaxation of strained SiGe has been reported after transportation onto a viscous layer, e.g., borosilicate glass (BSG), by P. D. Moran, et al., *Kinetics of Strain Relaxation in Semiconductor Films Grown on Borosilicate Glass-Bonded Substrates*, Journal of Electronics Materials, Vol. 30, No. 7, 2001, 802; and R Huang et al., *Relaxation of a Strained Elastic Film on a Viscous Layer*, Mat Res. Soc. Symp. Proc. Vol 695, 2002.

SUMMARY OF THE INVENTION

A method of forming a silicon-germanium layer on an insulator includes preparing a silicon substrate; depositing a layer of silicon-germanium on the silicon substrate to form a silicon/silicon-germanium portion; implanting hydrogen ions in the silicon-germanium layer, preparing an insulator substrate; bonding the silicon/silicon-germanium portion to the insulator substrate with the silicon-germanium layer in contact with the insulator substrate to form a bonded entity; curing the bonded entity; and thermally annealing the bonded entity to split the bonded entity into a silicon/silicon-germanium portion and a silicon-germanium-on-insulator portion and to relax the silicon germanium layers.

It is an object of the invention to provide for the relaxation of SiGe transferred directly on a glass substrate.

Another object of the invention to provide a method of fabrication for a relaxed SiGe layer-on-insulator.

A further object of the invention is to provide for a relaxed SiGe layer following transfer of a strained SiGe layer, or following transfer of a strained SiGe layer covered with a thin epitaxial silicon layer.

Still another object of the invention is to perform the relaxation step at the film transfer step, with out the need for a subsequent annealing step.

Another object of the invention is to provide a process which is simpler, cheaper, and wherein the resulting film contains fewer defects than films made by prior art techniques.

This summary and objectives of the invention are provided to enable quick comprehension of the nature of the invention. A more thorough understanding of the invention may be obtained by reference to the following detailed description of the preferred embodiment of the invention in connection with the drawings.

BRIEF DESCRIPTION OF THE DRAWINGS

FIGS. 2–9 depicts steps of the method of the invention.

DETAILED DESCRIPTION OF THE PREFERRED EMBODIMENTS

The method of the invention discloses a technique for fabrication of a relaxed SiGe layer-on-insulator, such as on a glass substrate. A film to be transferred is a strained SiGe layer, or a strained SiGe layer covered with thin epitaxial silicon. Relaxation occurs at the film transfer step, wherein subsequent annealing after wafer transfer is not necessary, eliminating at least one step from prior art fabrication techniques. The process is simpler, cheaper, and the resulting film contains fewer defects than films made by prior art techniques. The resulting SiGe layer-on-insulator may be used in the fabrication of various high-speed devices which are formed on glass. The SiGe/Si portion, after removal of the SiGe film, may be used to fabricate strained silicon-on-glass devices.

By directly attaching a layer of strained SiGe onto glass, e.g., Corning 1737 AMLCD glass substrate, proper relaxation of the SiGe layer occurs at the splitting-anneal step. The strained silicon layer may be either a graded SiGe layer or SiGe with a fixed germanium content.

Figure 1:
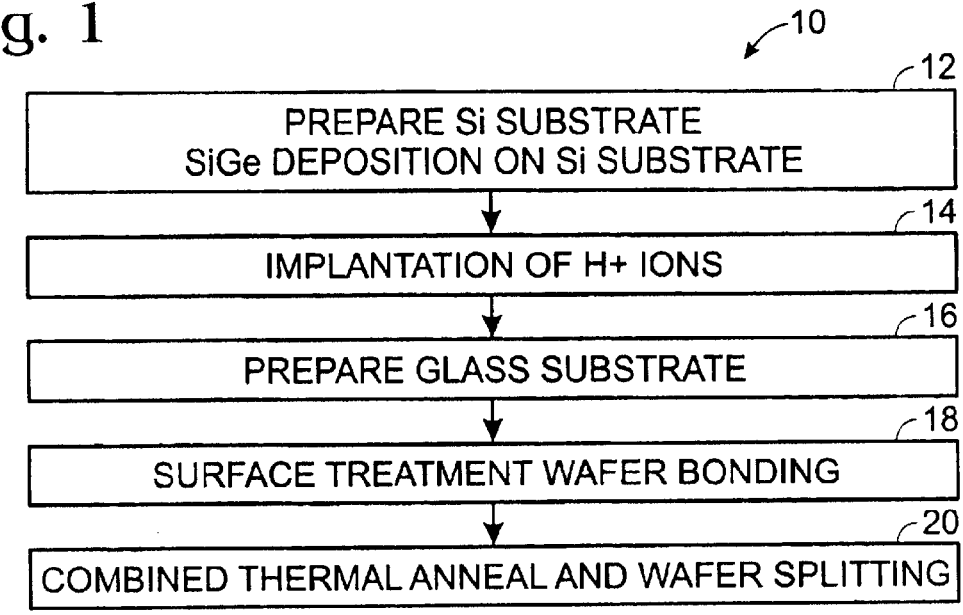
FIG. 1 is a block diagram of the method of the invention.

The method of the invention is depicted in block diagram form, generally at 10, in FIG. 1, and includes the steps of:
1. Preparation of a silicon substrate and deposition of a SiGe layer thereon, block 12.
2. Implantation of hydrogen ions, block 14.
3. Preparation of a glass substrate, block 16.
4. Surface treatment of the glass substrate and bonding of the SiGe layer to the glass substrate, block 18.
5. Thermal annealing, at a temperature of between about 350° C. to 700° C. for between about 30 minutes to four hours, of the bonded structures to facilitate wafer splitting, block 20.

In a variation of the method of the invention, a layer of epitaxial silicon may be deposited on the SiGe after proper process, e.g., after SiGe deposition to reduce SiGe layer thickness and to smooth the surface by CMP or oxidation and etching.

Figure 2:
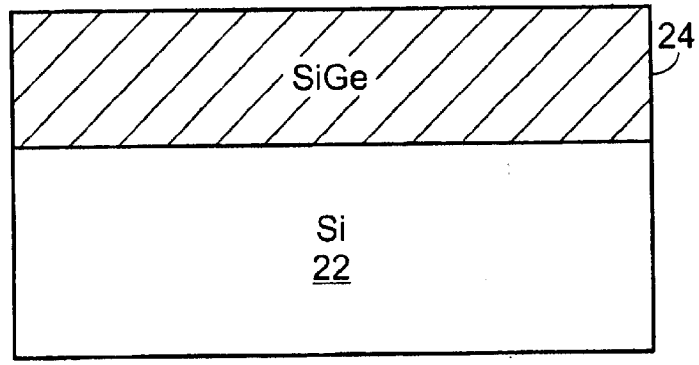

FIG. 2 depicts a step of silicon substrate 22 preparation and epitaxial SiGe layer 24 deposition on silicon wafer 22. The germanium concentration is in a range of between about 10% to 60%, and may be graded or of uniform concentration throughout the SiGe layer. SiGe layer 24 has a thickness of between about 20 nm to 1000 nm. SiGe layer 24 is under biaxial compression strain and no relaxation occurs at this time.

Figure 3:
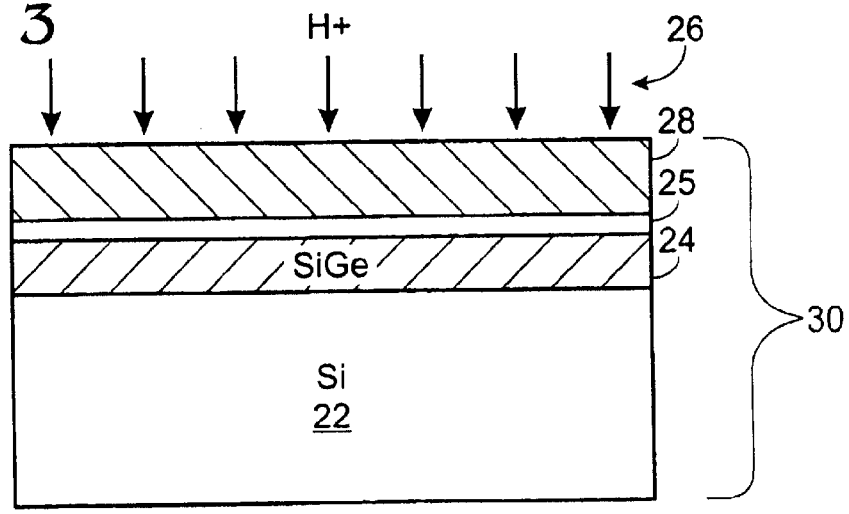

FIG. 3 depicts the hydrogen ion implantation step 26, wherein $H^+$ or $H_2^+$ ions are implanted into SiGe layer 24. The dose is ion a range of between about $1\times10^{16}$ cm$^{-2}$ to $5\times10^{17}$ cm$^{-2}$, and the energy is in a range of between about 1 keV to 300 keV. Other gases, such as argon, helium, and/or boron may also be used or added in the implant step. The hydrogen is implanted in the SiGe layer, as indicated by region 25, while remaining SiGe layer 24, located below region 25, and a layer 28, located above layer 25, have relatively low hydrogen concentrations. The structure thus far described comprises what is referred to herein as the Si/SiGe portion, and is collectively identified by reference number 30.

Figure 4:
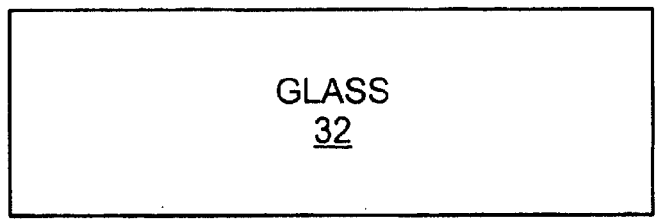

FIG. 4 depicts preparation of a glass substrate 32, which is treated to clean the substrate with a dilute SC-1 ($H_2O:H_2O_2:NH_4OH=5:1:1$) solution, followed by a water rinse and drying.

Figure 5:
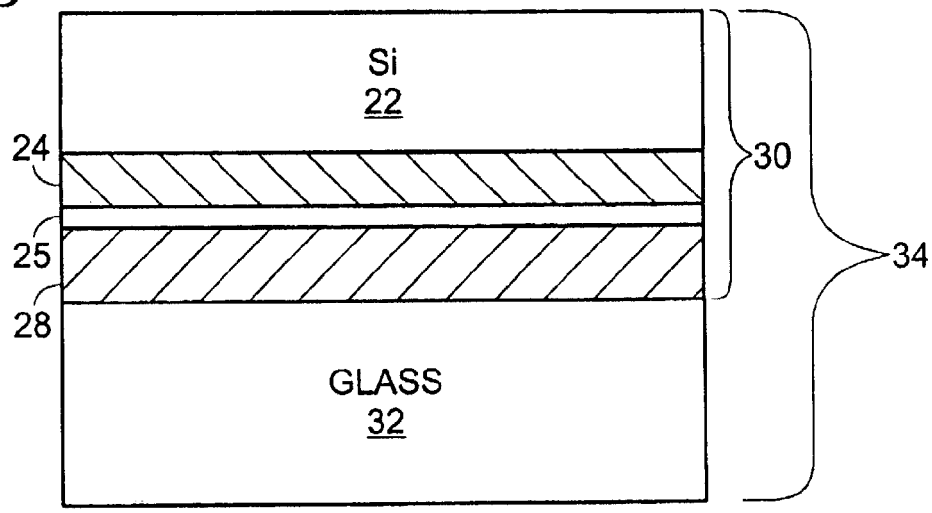

FIG. 5 depicts bonding of Si/SiGe portion 30 to glass substrate 32, forming a bonded entity, or couplet, 34, by direct wafer bonding. In direct wafer bonding, the surfaces of both portions are cleaned in a modified SC-1 cleaning solution and rinsed in distilled water. After drying, at less than 90° C., both surfaces are hydrophilic. The dried, hydrophilic-exposed portions facing one another, are brought into contact at ambient temperature. The bonding is initialized in a small area of the touching wafers by pressing the wafers together to squeeze out trapped air. The bonded area quickly spreads over the entire in-contact surfaces, within a few seconds. The now bonded entity is cured at a temperature of between about 150° C. to 250° C. for between about one hour to fourteen hours.

Figure 6:
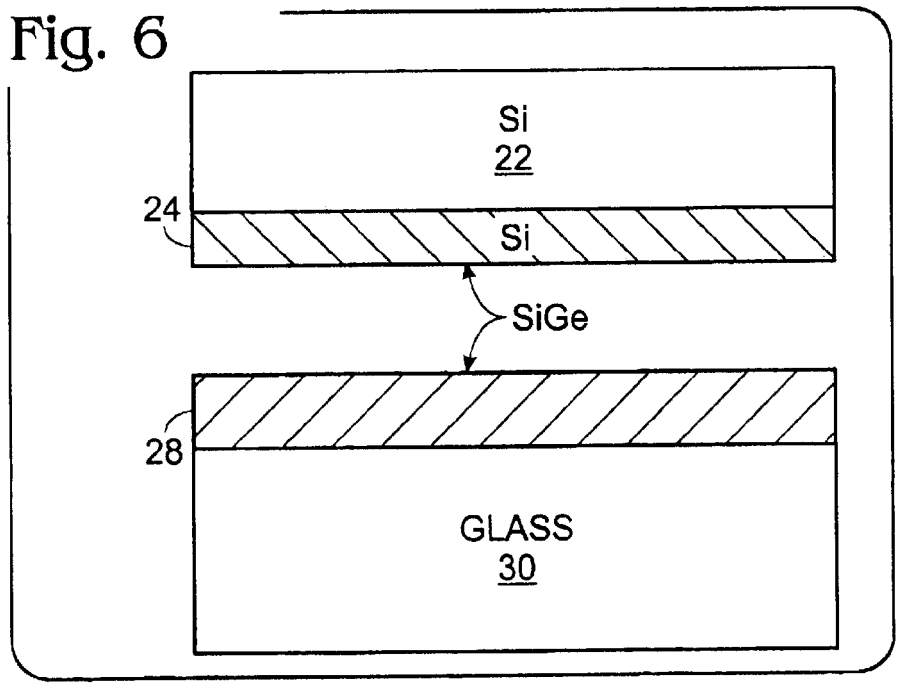

FIG. 6 depicts splitting of bonded entity 34 by thermal annealing at a temperature of between about 350° C. to 700° C. for between about 30 minutes to four hours, to separate silicon wafer 22 and SiGe layer 24 portion, also referred to herein as the silicon substrate portion, from glass substrate 32 and SiGe layer 28, which comprises a SiGe-on-glass portion 36. At this point, layer 24 has a thickness of between about 100 nm to 500 nm, and SiGe layer 28 has a thickness of between about 10 nm to 500 nm, and the SiGe layers have relaxed as a result of the thermal anneal. The couplet splits along hydrogen-implantation-induced microcracks, which are formed in high hydrogen concentration SiGe layer 25.

An alternative method to form strained silicon is by depositing a thin epitaxial silicon layer at the beginning after SiGe deposition. After bonding and splitting, both silicon and SiGe are transferred onto the glass surface. The SiGe layer is removed by proper oxidation and etch step, leaving only a thin strain silicon layer on glass, which may be used for fabrication of strained silicon-on-insulator, high-speed devices.

FIG. 7 depicts an epitaxially deposited SiGe layer 42 on a silicon wafer 40. The germanium concentration is in a range of between about 10% to 60%, and may be graded or constant. The epitaxial SiGe layer thickness is between about 20 nm to 1000 nm. SiGe is under biaxial compression strain and no relaxation occurs at this time. An thin epitaxial silicon layer 44 is deposited on SiGe surface. A glass substrate 46 is prepared as in the first described embodiment of the method of the invention.

FIG. 8 depicts the split wafers after thermal annealing.

FIG. 9 depicts the glass portion after removal of the SiGe layer.

Experimental Results of Bonding of SiGe on Corning 1737 Glass

The following are the results of attaching graded SiGe layer to glass. A relaxation of about 80% is achieved. Three wafers with $H_2^+$ implanted SiGe layers were successfully bonded to Corning 1737 glass substrates. After a long cure, e.g. between about one hour to fourteen hours at between about 150° C.–250° C., the wafers were annealed, for between about 30 minutes to one hour, to facilitate wafer splitting.

Figure 10:
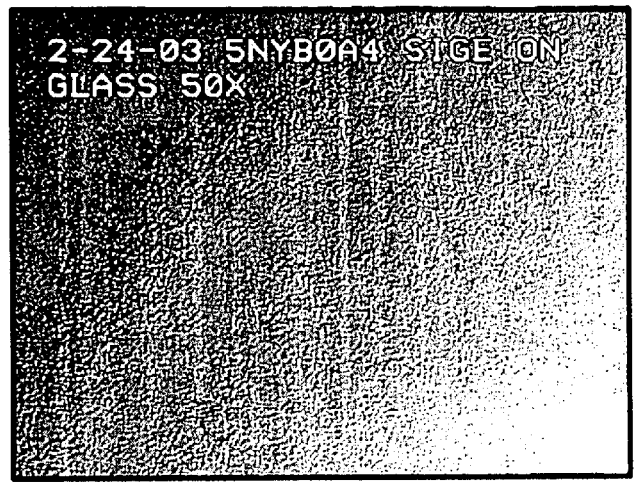
FIGS. 10–17 depict the results of the method of the invention.

FIG. 10 depicts the SiGe-on-glass portion, at 50X, from the first SiGe/glass couplet, which was split in RTP at about 600° C. for about 60 minutes, following a 15 second ramp up time.

Figure 11:
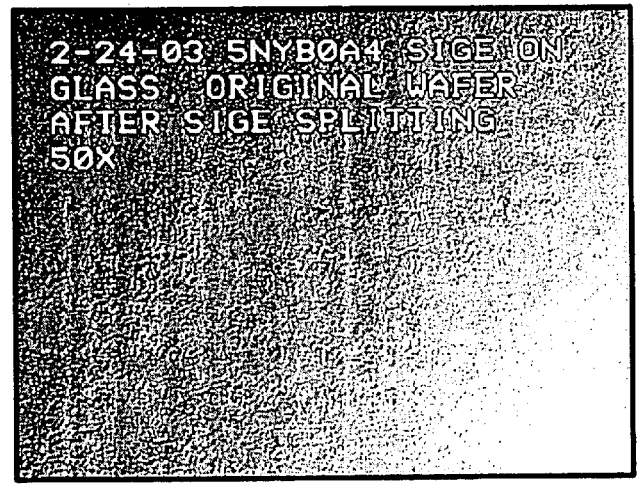

FIG. 11 depicts the silicon substrate portion of the first SiGe/glass couplet at 50X.

Figure 12:
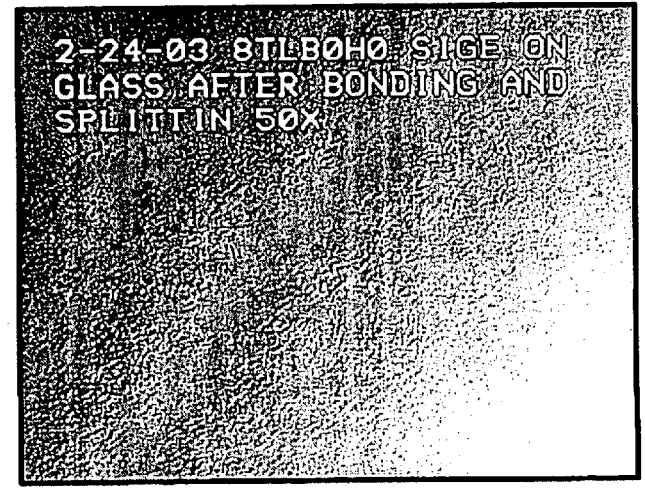

FIG. 12 depicts the SiGe film on glass portion, at 50X, from the second SiGe/glass couplet, which was split in RTP at about 650° C. for about 60 minutes, following a 5 second ramp up time.

Figure 13:
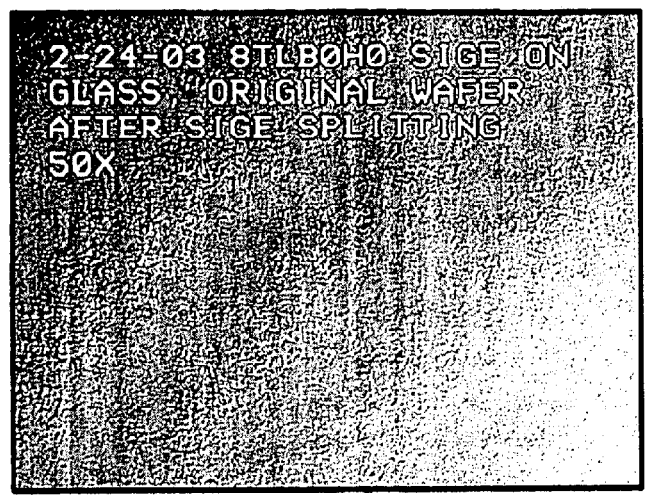

FIG. 13 depicts the silicon substrate portion of the second SiGe/glass couplet at 50X.

Figure 14:
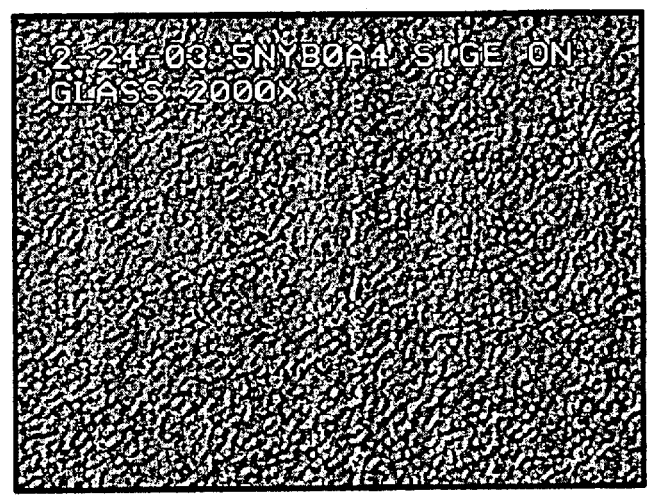

FIG. 14 depicts the SiGe film on glass portion, at 2000X, from the first SiGe/glass couplet, which was split in RTP at about 600° C. for about 60 minutes, following a 15 second ramp up time.

Figure 15:
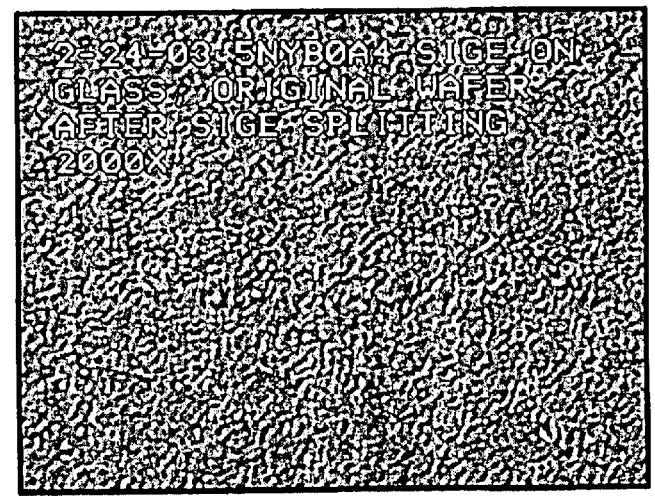

FIG. 15 depicts the silicon substrate portion of the first SiGe/glass couplet at 2000X.

Figure 16:
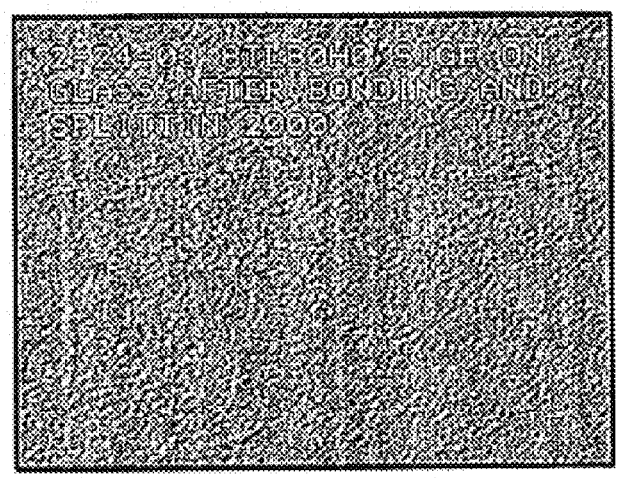

FIG. 16 depicts the SiGe film on glass portion, at 2000X, from the third SiGe/glass couplet, which was split in RTP at about 650° C. for about 60 minutes, following a 5 second ramp up time.

Figure 17:
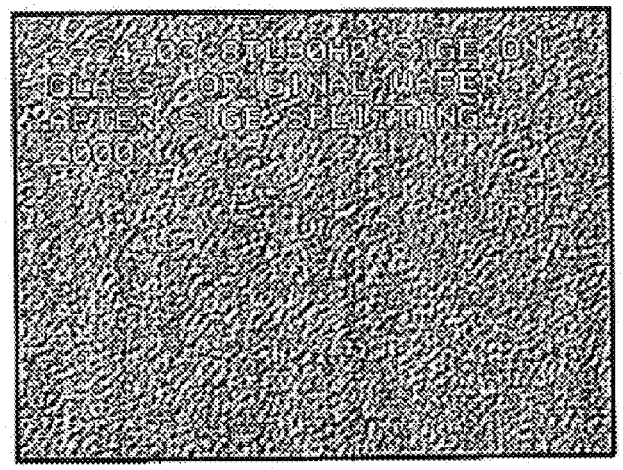

FIG. 17 depicts the silicon substrate portion of the third SiGe/glass couplet at 2000X.

Figure 18:
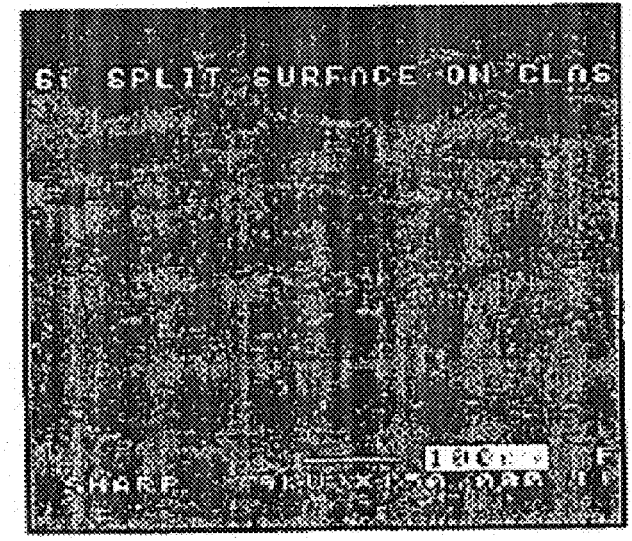
FIGS. 18–20 depict SEM photos of the results of the method of the invention.
Figure 19:
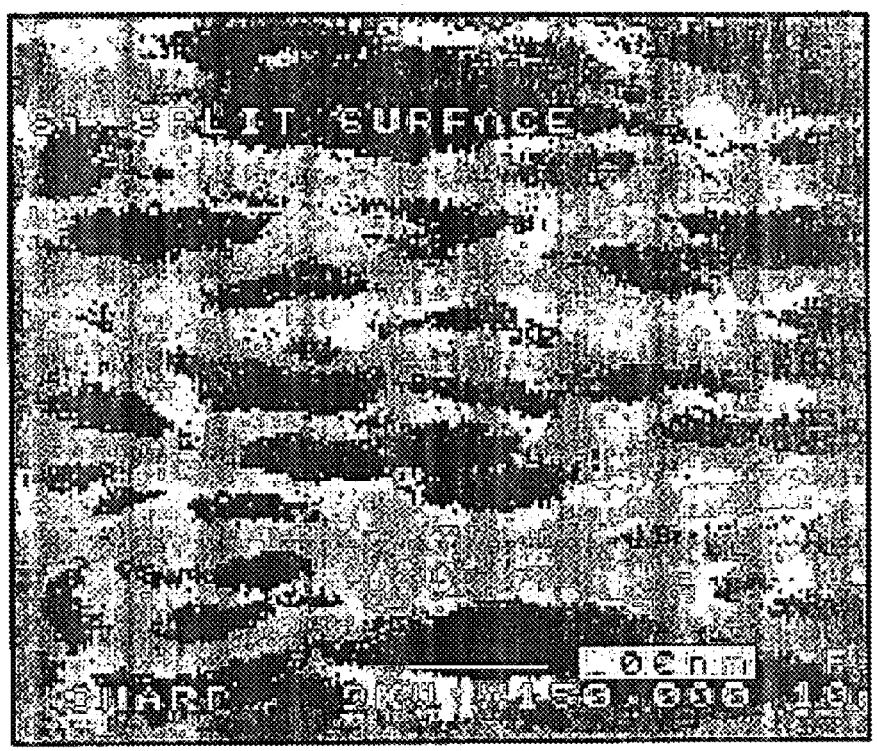
Figure 20:
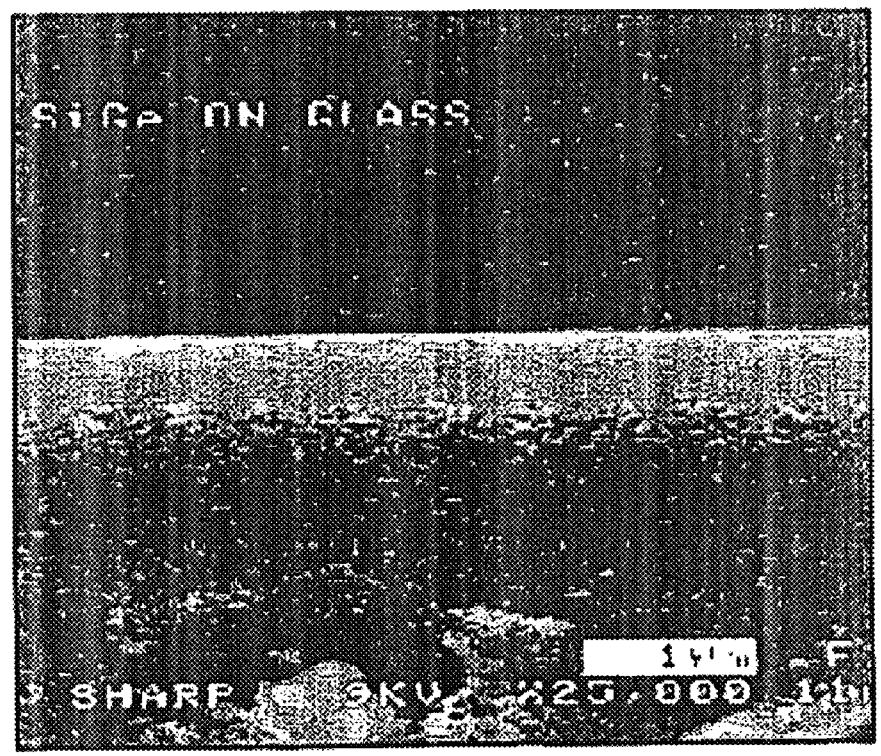

In all instances, the surfaces are smooth following thermal anneal splitting. The roughness and surface feature on both surfaces of the split couplets are very similar. SEM micrographs of the wafer couplet split at 600° C. are shown in FIGS. 18–20. The cross-section SEM indicates that the SiGe/glass interface is quite intact without any voids or cracks. The surface is also relatively flat.

FIG. 18 depicts the surface of the SiGe film on glass from the first SiGe/glass couplet; FIG. 19 depicts the silicon portion of the first SiGe/glass couplet; and FIG. 20 is a SEM cross-section of SiGe film on glass from the first SiGe/glass couplet.

Figure 21:
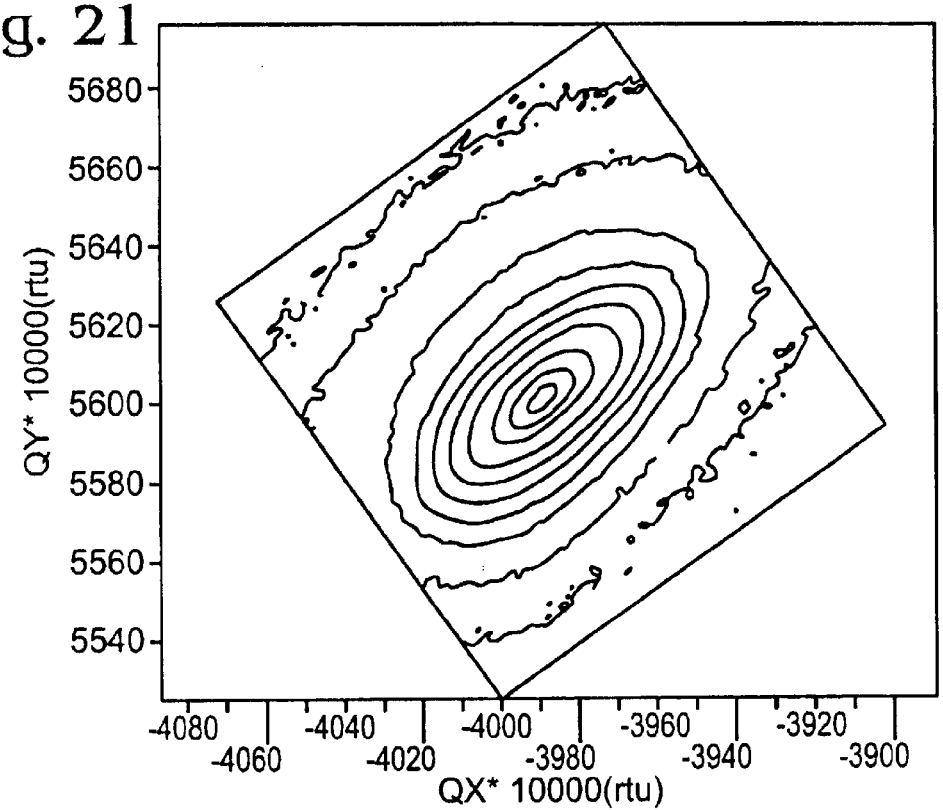
FIGS. 21–22 depict XRD mapping of the results of the method of the invention.
Figure 22:
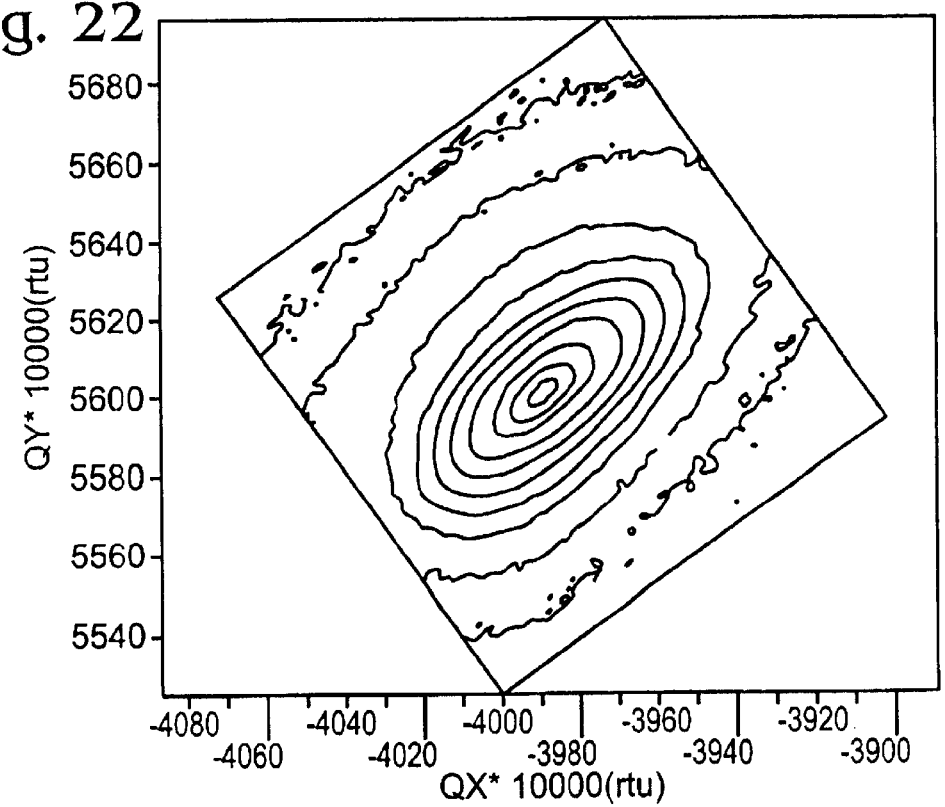

The degree of relaxation of the SiGe layer was determined by XRD mapping, and the results depicted in FIGS. 21–22: FIG. 21 depicts SiGe film on glass from the first SiGe/glass couplet, having peak FWHM parallel to surface=0.31°; SiGe (224) peak gives x=0.259, R=59%. FIG. 22 depicts SiGe film on glass from the second SiGe/glass couple, having x=0.26, R~78%; SiGe (004) FWHM parallel to surface= 0.274°.

An important feature of the invention is that the thermal annealing step which is used to split the combined structure into the silicon and glass portions also facilitates relaxation of a strained SiGe layer.

Thus, a method of making relaxed silicon-germanium on glass via layer transfer has been disclosed. It will be appreciated that further variations and modifications thereof may be made within the scope of the invention as defined in the appended claims.

We claim:

1. A method of forming a silicon-germanium layer on an insulator, comprising:
   preparing a silicon substrate;
   depositing a layer of silicon-germanium on the silicon substrate to form a silicon/silicon-germanium portion;
   implanting hydrogen ions in the silicon-germanium layer, including implanting hydrogen ions taken from the group of hydrogen ions consisting of $H^+$ ions and $H_2^+$ ions, at an ion dose of between about $1$–$10^{16}$ cm$^{-2}$ and $5$–$10^{17}$ cm$^{-2}$ at an energy of between about 1 keV to 300 keV;
   preparing an insulator substrate;
   bonding the silicon/silicon-germanium portion to the insulator substrate with the silicon-germanium layer in contact with the insulator substrate to form a bonded entity;
   curing the bonded entity; and
   thermally annealing the bonded entity to split the bonded entity into a silicon/silicon-germanium portion and a silicon-germanium-on-insulator portion and to relax the silicon germanium layers.

2. The method of claim 1 which further includes depositing an epitaxial silicon layer on the hydrogen-implanted silicon germanium layer before said bonding; and removing the silicon germanium layer from the silicon-germanium-on-insulator portion after said thermal annealing to form a relaxed silicon-on-insulator portion.

3. The method of claim 1 wherein said preparing an insulator substrate includes preparing a glass substrate.

4. The method of claim 1 wherein said depositing a layer of silicon-germanium on the silicon substrate includes depositing a layer of silicon-germanium to a thickness of between about 20 nm to 1000 nm in biaxial compression strain form at a germanium concentration of between about 10% to 60%, and wherein the germanium concentration is distributed in the layer taken from the group of distributions consisting of uniform distribution and graded distribution.

5. The method of claim 1 which includes implanting ions taken from the group of ions consisting of argon, helium and boron.

6. The method of claim 1 wherein said bonding the silicon/silicon-germanium portion to the insulator substrate with the silicon-germanium layer in contact with the insulator substrate to form a bonded entity includes bonding by direct wafer bonding.

7. The method of claim 1 wherein said curing the bonded entity includes curing the bonded entity at a temperature of between about 150° C. to 250° C. for a time of between about one hour to fourteen hours.

8. The method of claim 1 wherein said thermally annealing the bonded entity includes annealing the bonded entity at a temperature of between about 350° C. to 700° C. for a time of between about 30 minutes to four hours.

9. A method of forming a silicon-germanium layer on a glass substrate, comprising:
   preparing a silicon substrate;
   depositing a layer of silicon-germanium on the silicon substrate to form a silicon/silicon-germanium portion;
   implanting hydrogen ions in the silicon-germanium layer;
   preparing a glass substrate;
   bonding the silicon/silicon-germanium portion to the glass substrate by direct wafer bonding with the silicon-germanium layer in contact with the glass substrate to form a bonded entity;
   curing the bonded entity at a temperature of between about 150° C. to 250° C. for a time of between about one hour to fourteen hours; and
   thermally annealing the bonded entity at a temperature of between about 350° C. to 700° C. for a time of between about 30 minutes to four hours to split the bonded entity into a silicon/silicon-germanium portion and a silicon-germanium-on-glass portion and to relax the silicon germanium layers.

10. The method of claim 9 which further includes depositing an epitaxial silicon layer on the hydrogen-implanted silicon germanium layer before said bonding; and removing the silicon germanium layer from the silicon-germanium-glass portion after said thermal annealing to form a relaxed silicon-on-glass portion.

11. The method of claim 9 wherein said depositing a layer of silicon-germanium on the silicon substrate includes depositing a layer of silicon-germanium to a thickness of between about 20 nm to 1000 nm in biaxial compression strain form at a germanium concentration of between about 10% to 60% and, and wherein the germanium concentration is distributed in the layer taken from the group of distributions consisting of uniform distribution and graded distribution.

12. The method of claim 9, wherein said implanting hydrogen ions in the silicon-germanium layer includes implanting hydrogen ions taken from the group of hydrogen ions consisting of $H^+$ ions and $H_2^+$ ions, at an ion dose of between about $1$–$10^{16}$ cm$^{-2}$ and $5$–$10^{17}$ cm$^{-2}$ at an energy of between about 1 keV to 300 keV.

13. The method of claim 12, which includes implanting ions taken from the group of ions consisting of argon, helium and boron.

* * * * *